United States Patent

Sonntag

(10) Patent No.: US 9,846,205 B1
(45) Date of Patent: Dec. 19, 2017

(54) MAGNETIC FIELD GENERATING COIL ON SENSOR DIE

(71) Applicant: Silicon Laboratories Inc., Austin, TX (US)

(72) Inventor: Jeffrey L. Sonntag, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 122 days.

(21) Appl. No.: 14/798,129

(22) Filed: Jul. 13, 2015

(51) Int. Cl.
*G01R 33/02* (2006.01)
*G01R 33/028* (2006.01)
*G01R 33/09* (2006.01)
*G01K 13/00* (2006.01)

(52) U.S. Cl.
CPC .............. *G01R 33/09* (2013.01); *G01K 13/00* (2013.01); *G01R 33/02* (2013.01)

(58) Field of Classification Search
CPC .......................... G01R 33/0035; G01R 33/02
USPC ......................................... 324/244
See application file for complete search history.

(56) References Cited

U.S. PATENT DOCUMENTS

| 7,694,200 B2 * | 4/2010 | Forrest ............. G01R 31/31724 714/733 |
| 8,253,414 B2 * | 8/2012 | Ausserlechner ... G01R 33/0035 324/249 |
| 8,878,528 B2 | 11/2014 | Quevy | |
| 2013/0134965 A1 * | 5/2013 | Friedrich ........... G01R 33/0023 324/202 |

* cited by examiner

*Primary Examiner* — Reena Aurora
(74) *Attorney, Agent, or Firm* — Zagorin Cave LLP

(57) ABSTRACT

An integrated circuit includes a magnetic sensor and a magnetic field generating coil. A control circuit on the integrated circuit responds to an activation indication received by the integrated circuit to cause activation of generation of a first magnetic field by the magnetic field generating coil. The control circuit responds to a subsequent activation indication to generate a second magnetic field different from the first magnetic field. The first magnetic field may have a polarity opposite to a polarity of the second magnetic field. A communication interface may be used to communicate one or more indications associated with an expected magnetic field strength, such as coil resistance, and a measured magnetic field strength measured by the magnetic sensor. The magnetic field generating coil may be coaxial with the magnetic sensor and the magnetic field generating coil may have an inner diameter greater than a diameter of the magnetic sensor.

20 Claims, 3 Drawing Sheets

MAGNETIC FIELD GENERATING COIL ON SENSOR DIE

BACKGROUND

Field of the Invention

This invention relates to magnetic sensors and more particularly to use of a magnetic field generating coil on the same die as the magnetic sensor to test the magnetic sensor.

Description of the Related Art

Magnetic sensors can be found in many applications across a wide range of industries. For example, magnetic sensors can be found in automotive, consumer, industrial, medical, and aerospace applications. In consumer applications, sensors may be used to detect when devices (e.g., cell phones, laptop computers, doors, etc.) are opened or closed. In addition, cell phones incorporate magnetic sensors to provide an electronic compass and navigation capability to complement GPS tracking.

With magnetic sensors being widely used, improvements in testing of magnetic sensors are desirable.

SUMMARY OF EMBODIMENTS OF THE INVENTION

Accordingly, in an embodiment, a method is provided that activates generation of a first magnetic field by a magnetic field generating coil disposed on an integrated circuit in response to an activation indication supplied to the integrated circuit. A magnetic sensor disposed on the integrated circuit measures the generated magnetic field. In response to a subsequent activation indication, the magnetic field generating coil generates a second magnetic field different from the first magnetic field. The magnetic sensor measures the second magnetic field. The first magnetic field may have a polarity opposite to a polarity of the second magnetic field.

In another embodiment an integrated circuit includes a magnetic sensor and a magnetic field generating coil. The magnetic field generating coil is coaxial with the magnetic sensor and the magnetic field generating coil has an inner diameter greater than a diameter of the magnetic sensor. A control circuit on the integrated circuit is responsive to an activation indication to cause activation of generation of a first magnetic field by the magnetic field generating coil. A first distance between the magnetic field generating coil and a semiconductor substrate on which the magnetic field generating coil and magnetic sensor are formed is less than a second distance between an inner edge of the magnetic field generating coil and an outer edge of the magnetic sensor. The control circuit may be responsive to a subsequent activation indication, to cause generation of a second magnetic field different from the first magnetic field.

In another embodiment, an integrated circuit includes a magnetic sensor, a magnetic field generating coil, and a control circuit on the integrated circuit responsive to an activation indication to cause activation of generation of a first magnetic field by the magnetic field generating coil. The integrated circuit also includes a communication interface to communicate one or more indications associated with expected magnetic field strength and a measured magnetic field strength measured by the magnetic sensor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Many different approaches have been used to detect magnetic fields including giant magneto-resistance (GMR), Fluxgate, anisotropic magnetoresistance (AMR), and Hall effect sensors, which exploit the Hall effect. In addition, MEMS based magnetic sensors have been described, e.g., in U.S. Pat. No. 8,878,528, which is incorporated herein by reference. Hall, GMR, AMR, and MEMS based sensors are of interest because of their ability to be integrated with integrated circuits, which provides a small form factor. In Hall effect sensors, when a voltage is applied across a semiconductor material, charge carriers begin to flow. If a magnetic field is applied perpendicular to the semiconductor material, the current carriers deflect to the side because of the Lorentz force causing a charge to build up on one side of the material. That results in a voltage across the semiconductor material perpendicular to the current carrier flow. The resulting Hall voltage is a measure of the magnetic field.

Figure 1:
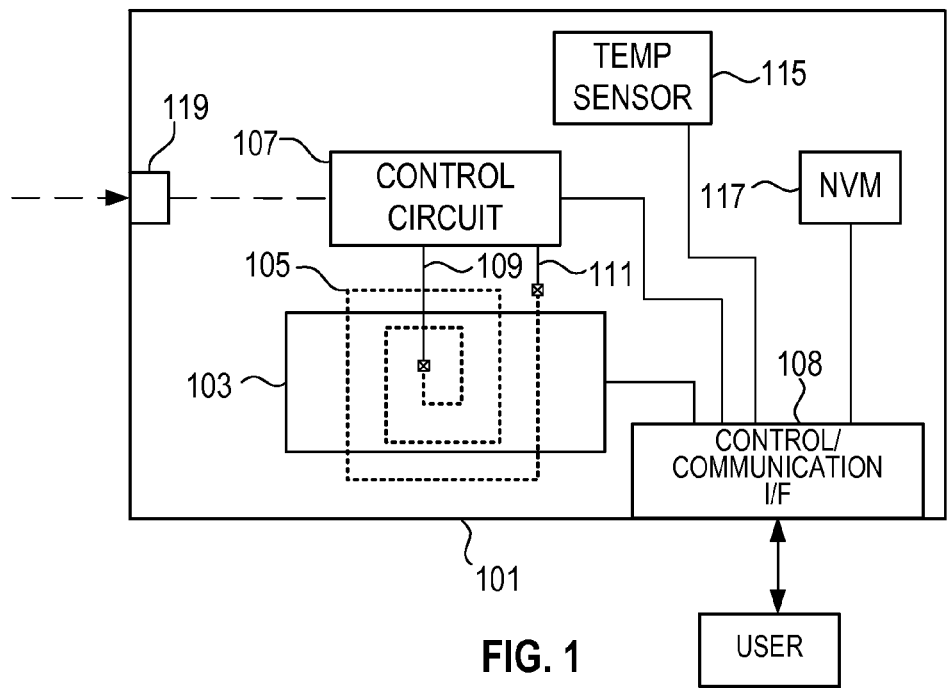
FIG. 1 illustrates an integrated circuit with a magnetic sensor and a magnetic field generating coil disposed on the integrated circuit that is used to test the magnetic sensor.

Referring to FIG. 1 illustrated is an exemplary integrated circuit 101. The integrated circuit includes a magnetic sensor 103. The magnetic sensor 103 may be any appropriate magnetic sensor including a Hall sensor or a MEMS based sensor. The integrated circuit 101 also includes a coil 105 that generates a magnetic field on-chip when DC current flows through the coil. The on-chip generated magnetic field can then be used to test the operation of the magnetic sensor without any need for external magnetic field sources.

In an embodiment, a control interface allows systems that use the integrated circuit 101 to activate the field generating coil. For example, the control circuit 107 responds to a control signal that may be provided on control interface 108 to activate the coil. The control circuit 107 can activate the coil by coupling nodes 109 and 111 to the integrated circuit supply voltage VDD and ground (or vice versa) to cause a current to flow through the magnetic field generating coil 105. The control interface may be, e.g., an input terminal (a pin 119), a serial interface such as I$^2$C, or an output terminal (pin) that is also used as a control input to activate the coil. For example, in conjunction with a binary open drain output, the output pin may be held low for at least a predetermined time period as the activation indication to activate the coil in the case where the output format has a protocol such as pulse width modulation (PWM) or Single Edge Nibble Transmission (SENT) or any of a number of non-static binary formatted output. Thus, depending on the type of control input, a command may be sent over the serial interface (control/communication interface 108) to activate the field generating coil, the input pin 119 may be set to a first voltage that activates the coil, or the output pin may be held low to activate the coil. Thus, the interface to communicate the measured magnetic field may be interface 108 and an input pin 119 may function as the control interface to receive activation indication. Where the communication interface pins are used to also receive the activation indication, the input pin 119 may be omitted. Responsive to the activate indication on the control input, the coil may be activated for a predetermined time period, based, e.g., on a counter in control circuit 107 or other timing mechanism. In other embodiments, a command may be sent to inactivate the coil over the serial interface, the input pin may be set to a second voltage to inactivate the coil, or the output pin may be released to inactivate the coil.

Figure 2:
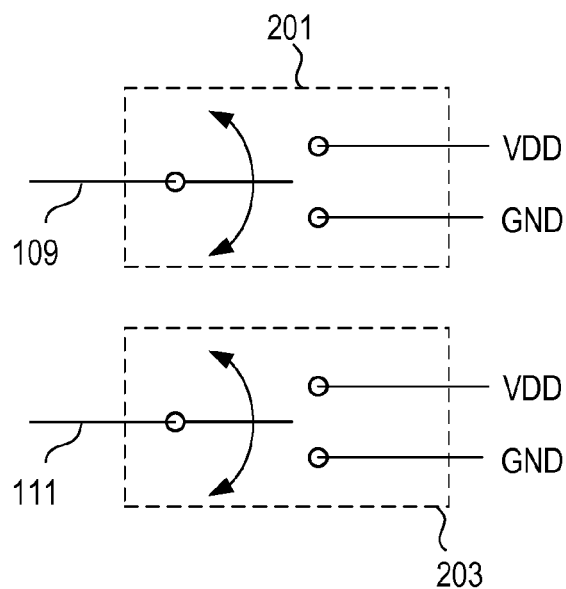
FIG. 2 illustrates an example of switches in control logic to couple the coil to supply voltages.

Once the control circuit 107 detects the indication to activate the coil, the control circuit couples the nodes 109 and 111 to appropriate voltages to cause current to flow in the coil. Referring to FIG. 2, the control circuit 107 may include switches 201 and 203 that may couple both nodes 109 and 111 to ground when the coil is not activated or switches 201 and 203 may both be off when the coil is not activated. Switches 201 and 203 couple one of the nodes to VDD and one of the nodes to ground when the coil is activated.

Figure 3A:
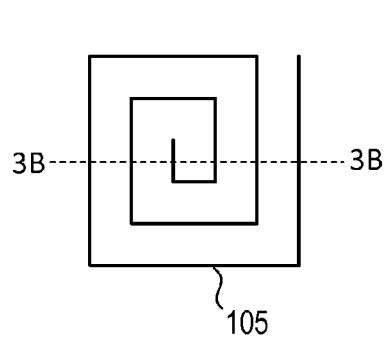
FIG. 3A illustrates an isolated top view of the magnetic field generating coil.
Figure 3B:
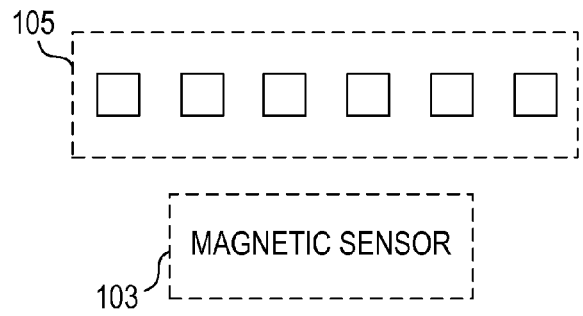
FIG. 3B illustrates a cross-sectional view of the coil and the magnetic sensor.

The generated magnetic field is dependent on geometry of the coil and the amount of current supplied to the coil. The amount of current supplied to the coil may be modulated by switching across the power supply, selectively enabling current sources, using digital-to-analog conversion techniques, or other suitable techniques for modulating a current supplied to the coil. FIG. 3A shows the coil 105 in isolation and FIG. 3B shows a cross sectional view of the sensor 103 and coil 105. The geometry of the coil shown in the figures is exemplary and the number of turns and the size of the conductors can vary according to the requirements of particular embodiments. The geometry is fixed by lithography, and the current can be determined based on measurements made during testing to get a very good estimate of the generated field or the current may be determined based on the supply voltage and the resistance of the coil. The coil may be formed in one or more metal layers of the integrated circuit and may be vertically displaced from the magnetic sensor. The coil may be formed to be coaxial with the sensor. The ratio of the vertical distance between the coil and the surface of the semiconductor substrate to the distance between the inner edge of the coil and the outer edge of the sensor may be determined for a particular design to reduce sensitivity of the magnetic sensor to the Z-axis component of the magnetic field.

Figure 4A:
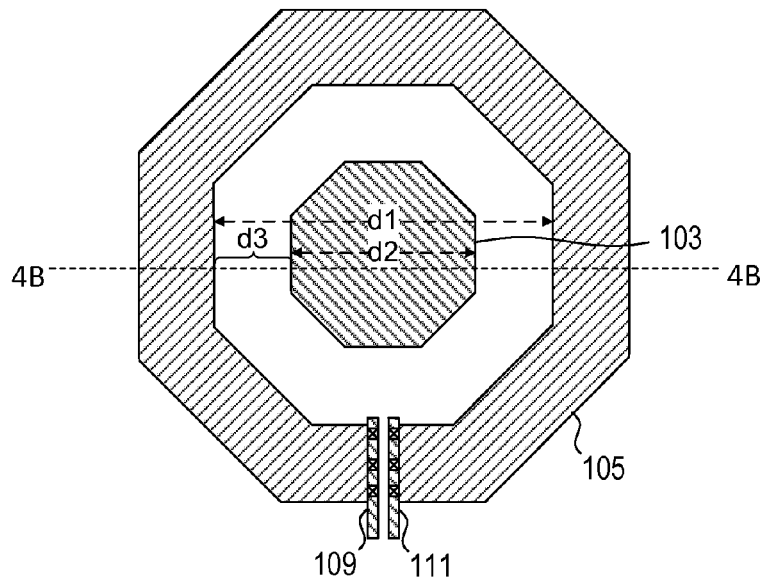
FIG. 4A illustrates a top view of the magnetic field generating coil and magnetic sensor.
Figure 4B:
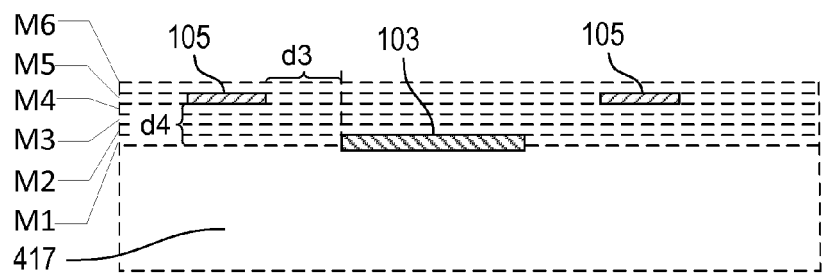
FIG. 4B illustrates a cross-sectional view of the magnetic field generating coil and magnetic sensor.
Figure 5:
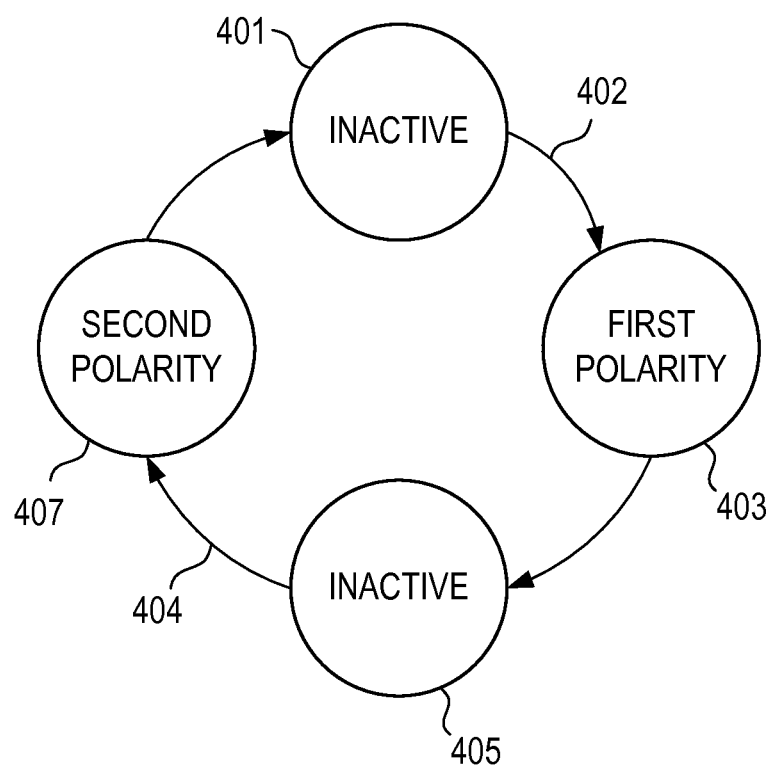
FIG. 5 illustrates an exemplary control flow to switch polarity of the magnetic field.

For example, referring to FIGS. 4A and 4B, coil 105 has a single turn and an inner diameter d1 that is greater than the diameter d2 of sensor 103. Coil 105 is formed using at least one conductive layer (e.g., M5) above semiconductor substrate 417, coaxially with sensor 103, and at a distance d4 above a surface of semiconductor substrate 417. Sensor 103 is formed to have an outer edge at a distance d3 from an inner edge of coil 105. In an exemplary embodiment using a particular semiconductor manufacturing process, distance d4 is approximately 3 µm, inner diameter d1 is substantially greater than diameter d2, and distance d3 is approximately 8-10 µm. The resulting ratio of distance d4 to distance d3 is less than 1:1. Note that by forming coil 105 in one or more upper layers of a semiconductor manufacturing process, typical integrated circuit devices may be formed beneath coil 105 using the semiconductor substrate 417 and other conductive layers and dielectric layers. However, coil 105 may be formed in one or more layers closer to semiconductor substrate 417. Although sensor 103 is illustrated as octagonal and coil 105 is illustrated as an octagonal loop formed using a particular conductive layer of a manufacturing process including six conductive layers (M1, M2, M3, M4, M5, and M6), other geometric shapes and conductive layers of different manufacturing processes may be used.

Since the current is determined by the supply voltage and resistance of the coil, the resistance of the coil can be measured for each part during manufacture and stored in one time programmable memory (or other non-volatile memory (NVM)) 117. Resistance changes in the coil due to process can be as much as 25 or 30 percent. In embodiments the memory 117 is accessible to the system (user) in which the magnetic sensor is utilized. The resistance value may be supplied on the communication interface that also supplies the magnetic field measurement. Note that the communication interface 108 may also function as the control interface. In other embodiments, the communication interface to supply the measured magnetic field and values from NVM 117 may be separate from the control interface used to activate the magnetic field. In embodiments, the user may utilize the resistance of the coil, the temperature of the coil, and the power supply voltage in order to determine the magnetic field. The temperature may also be supplied over the communication interface.

In an embodiment, for each manufactured part, the supply voltage to field generated ratio is measured and the resulting calibration factor is stored in user-accessible memory 117 so that users who cannot measure the supply current can simply measure the supply voltage available in the system, in order to calculate the field strength produced by the activation of the coil. Thus, the user, who receives both the measured magnetic field and the expected magnetic field (or information from which the expected magnetic field can be calculated such as coil resistance) will be able to determine the accuracy of the magnetic sensor while the magnetic sensor is in the field. In embodiments where the supply voltage cannot be measured by the user, the user may "know" the supply voltage based on system specifications. Thus, e.g., the supply voltage may be known with an accuracy of ±5%, which allows a good estimate of the field strength to be supplied from the memory 117.

In determining the expected magnetic field generated, the expected resistance change with temperature for the coil can be modeled (including the anticipated temperature rise with current in the coil), and a good estimate of the magnetic field generated can be obtained without any calibrations by just knowing the die junction temperature. For example, the magnetic field can be determined according to the simplified expression $$B_z = F \times \frac{VDD}{R_{COIL}},$$

wherein F is in Teslas/amp, VDD is supply voltage across the coil and $R_{COIL}$ is the resistance across the coil. The term F represents the transduction of current through the coil to magnetic field. That equation ignores temperature dependence and supply dependence, which is shown in the more detailed equation below:

$$B_z = 5.5 \ mT \cdot \left(\frac{VDD}{5}\right) \cdot \left(\frac{300K}{T_{j,C} + 44K + 273K}\right) \cdot (2 \cdot dir - 1),$$

where mT is milliTeslas and VDD is voltage across the coil. The next term $$\left(\frac{300K}{T_{j,C} + 44K + 273K}\right)$$

represents temperature of the coil based on the junction temperature, adjusted by the rise in temperature caused by current through the coil. The junction temperature $T_{j,c}$ represents junction temperature in degrees C., which may be measured by temperature sensor 115 (see FIG. 1). The remaining terms are in Kelvin. The final term represents the polarity of the field and thus dir may be 0 or 1. The determination of the magnetic field may be made on integrated circuit 101 if there are sufficient processing resources to calculate the equations shown above. For example, the control logic 107 may be a microcontroller that not only responds to commands but determines expected field strength based on stored values of resistance, and measured or assumed supply voltage and temperature. In other embodiments, the integrated circuit 101 supplies coil resistance and temperature as the indication of field strength, which is calculated off chip by the system in which the sensor is utilized.

The measured magnetic field has a signal to noise ratio (SNR) and because the magnetic field generated is small, improvement in the SNR is desirable. For example a 5 volts supply may generate only six or seven milliTeslas, a magnetic field weaker than a refrigerator magnet. If a 1.3 V supply is used, a magnetic field of approximately 2 mT will be generated by the coil. Thus, because the magnetic field is small, measurement accuracy is susceptible to noise. By taking two measurements with opposite polarity of the magnetic field, the signal is increased by a factor of two, thereby increasing the SNR by 6 dB.

In some embodiments, a binary output is provided by the integrated circuit 101 that is based on the measured magnetic field crossing a threshold. That threshold could be in one polarity and not the other. Thus, measuring both polarities allows a more thorough test of operation of the magnetic sensor.

The polarity of the generated magnetic field may be switched by switching the polarity of the voltage across the coil. The polarity may be controlled by the switches 201 and 203 in the control circuit 107 using control logic shown in FIG. 4. Before activation control logic keeps the coil in an inactive state 401 and the switches couple nodes 109 and 111 to ground. On the first activation 402 the switches are set to have the first polarity in 403 in which, e.g., node 109 is coupled to VDD and node 111 to ground. After activation, the control returns to the inactive state 405 after a predetermined time limit or in response to a control input and the nodes 109 and 111 are again coupled to ground. On a subsequent activation 404, the switches reverse the polarity of the magnetic field by coupling node 111 to VDD and 109 to ground in 407. The coil then returns to the inactive state 401.

The use of the on-board magnetic field generating coil allows the part to be tested autonomously with no-external sources. The on-board magnetic field generating coil allows for a built-in self test mode to confirm proper operation of the magnetic sensor when the part is out in the field (periodic in-situ testing), which can be especially valuable for certain markets such as automotive or defense. Thus, knowing the resistance of the coil, the power supply voltage, and the junction temperature allows in situ testing with good accuracy.

Any lithography/processing variation in geometry can also be calibrated out by doing calibration with an external magnetic source once. Then subsequent measurements (including those at high temperature where conventional external magnetic sources change field strength) can be done autonomously with high accuracy, since a baseline calibration for lithographic variation has already been performed, and the current through the coil can be measured using external instrumentation to figure out magnetic field strength.

The description of the invention set forth herein is illustrative, and is not intended to limit the scope of the invention as set forth in the following claims. For example, while the invention has been described in an embodiment in which calibration is based on measurements of two magnetic fields having opposite polarity, one of skill in the art will appreciate that the teachings herein can be utilized with calibration based on measurements of two different magnetic fields of the same polarity (e.g., measuring sensor output with the coil on and measuring the sensor output with the coil off or receiving a different current). Variations and modifications of the embodiments disclosed herein, may be made based on the description set forth herein, without departing from the scope and spirit of the invention as set forth in the following claims.

What is claimed is:
1. A method comprising:
    activating generation of a first magnetic field by a magnetic field generating coil disposed on an integrated circuit responsive to an activation indication supplied to the integrated circuit;
    measuring the first magnetic field using a magnetic sensor disposed on the integrated circuit; and
    responsive to a subsequent activation indication, activating the magnetic field generating coil to cause generation of a second magnetic field different from the first magnetic field; and
    measuring the second magnetic field using the magnetic sensor.
2. The method as recited in claim 1 wherein the first magnetic field has a polarity opposite to a polarity of the second magnetic field.
3. The method as recited in claim 1 further comprising holding an open drain output pin low as the activation indication where the output pin has a non-static binary formatted output or using a serial interface to communicate the activation indication to the integrated circuit.
4. The method as recited in claim 1 further comprising:
    supplying from the integrated circuit an indication of an expected magnetic field generated by the coil.
5. The method as recited in claim 1 further comprising:
    storing in non-volatile memory on the integrated circuit at least one of a resistance value of the magnetic field generating coil and an indication of one or more magnetic fields generated by the coil for one or more supply voltages.

6. The method as recited in claim 1 further comprising:
estimating the first magnetic field generated by the magnetic field generating coil using, in part, a measured die junction temperature, resistance of the coil, and voltage across the magnetic field generating coil.

7. The method as recited in claim 1 wherein the magnetic field generating coil has an inner diameter greater than a diameter of the magnetic sensor.

8. An integrated circuit comprising:
a magnetic sensor;
a magnetic field generating coil coaxial with the magnetic sensor, the magnetic field generating coil having an inner diameter greater than a diameter of the magnetic sensor; and
a control circuit on the integrated circuit responsive to an activation indication received by the integrated circuit to cause activation of generation of a first magnetic field by the magnetic field generating coil for measurement by the magnetic sensor and the control circuit is responsive to a subsequent activation indication to activate the magnetic field generating coil to cause generation of a second magnetic field different from the first magnetic field for measurement by the magnetic sensor.

9. The integrated circuit as recited in claim 8 wherein a first distance between the magnetic field generating coil and a semiconductor substrate above which the magnetic field generating coil is formed and on which the magnetic sensor is formed, is less than a second distance between an inner edge of the magnetic field generating coil and an outer edge of the magnetic sensor.

10. The integrated circuit as recited in claim 9 wherein the second distance is at least twice the first distance.

11. The integrated circuit as recited in claim 8 wherein the first magnetic field and the second magnetic field have opposite polarity.

12. The integrated circuit as recited in claim 8 wherein the activation indication is supplied to the integrated circuit by holding an output pin low, wherein the output pin has a non-static binary formatted output.

13. The integrated circuit as recited in claim 8 further comprising a serial interface to receive the activation indication.

14. The integrated circuit as recited in claim 8 further comprising a communication interface to supply an indication of expected magnetic field strength and a measured magnetic field measured by the magnetic sensor.

15. An integrated circuit comprising:
a magnetic sensor;
a magnetic field generating coil;
a control circuit on the integrated circuit responsive to an activation indication received by the integrated circuit to cause activation of generation of a magnetic field by the magnetic field generating coil for measurement by the magnetic sensor; and
non-volatile memory configured to store at least one of an indication of resistance of the magnetic field generating coil and an indication of one or more magnetic fields generated by the magnetic field generating coil for one or more supply voltages.

16. An integrated circuit comprising:
a magnetic sensor;
a magnetic field generating coil;
a control circuit on the integrated circuit responsive to an activation indication received by the integrated circuit to cause activation of generation of a magnetic field by the magnetic field generating coil for measurement by the magnetic sensor; and
a temperature sensor to supply a measured die junction temperature for use in generating an estimate of the magnetic field, the estimate based on, at least in part, resistance of the coil, voltage across the magnetic field generating coil, and the measured die junction temperature.

17. An integrated circuit comprising:
a magnetic sensor;
a magnetic field generating coil;
a control circuit on the integrated circuit responsive to an activation indication to cause activation of generation of a first magnetic field by the magnetic field generating coil; and
a communication interface to communicate one or more indications associated with an expected magnetic field strength and a measured magnetic field strength measured by the magnetic sensor.

18. The integrated circuit as recited in claim 17 further comprising:
non-volatile memory storing a resistance value of the magnetic field generating coil and wherein the one or more indications include the resistance value.

19. The integrated circuit as recited in claim 17 further comprising:
non-volatile memory storing a plurality of values of magnetic field strength generated by the coil respectively associated with a plurality of supply voltages.

20. The integrated circuit as recited in claim 17 further comprising:
a temperature sensor to supply a measured die junction temperature for use in estimating the magnetic field generated by the magnetic field generating coil using, in part, resistance of the coil, and voltage across the magnetic field generating coil, and the measured die junction temperature.

* * * * *